United States Patent
Luck

(10) Patent No.: US 10,304,556 B2
(45) Date of Patent: May 28, 2019

(54) READ AND WRITE MEMORY SCRUBBER

(71) Applicant: Intel Corporation, Santa Clara, CA (US)

(72) Inventor: Anthony E. Luck, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/395,590

(22) Filed: Dec. 30, 2016

(65) Prior Publication Data

US 2018/0190365 A1    Jul. 5, 2018

(51) Int. Cl.

| | |
|---|---|
| *G06F 3/06* | (2006.01) |
| *G11C 29/36* | (2006.01) |
| *G11C 29/38* | (2006.01) |
| *G11C 29/44* | (2006.01) |
| *G11C 29/52* | (2006.01) |
| *G11C 29/00* | (2006.01) |

(52) U.S. Cl.
CPC .............. *G11C 29/38* (2013.01); *G06F 3/064* (2013.01); *G06F 3/0608* (2013.01); *G06F 3/0619* (2013.01); *G06F 3/0652* (2013.01); *G06F 3/0673* (2013.01); *G11C 29/36* (2013.01); *G11C 29/44* (2013.01); *G11C 29/52* (2013.01)

(58) Field of Classification Search
CPC ...... G06F 3/0608; G06F 3/0619; G06F 3/064; G06F 3/0652; G06F 3/0673; G11C 29/36; G11C 29/38
See application file for complete search history.

(56) References Cited

U.S. PATENT DOCUMENTS

| | | | |
|---|---|---|---|
| 2004/0088614 A1* | 5/2004 | Wu | G11C 29/88 714/718 |
| 2017/0031753 A1* | 2/2017 | Chinnakkonda Vidyapoornachary | G06F 11/106 |

* cited by examiner

*Primary Examiner* — Guy J Lamarre
(74) *Attorney, Agent, or Firm* — Lowenstein Sandler LLP

(57) ABSTRACT

An example system that includes a processor, a memory controller, a memory, and a memory device. The memory controller coupled to the processor. The memory coupled to the memory controller, the memory to store a first copy of data stored according to a first test data pattern for use by a memory scrubbing operation. The memory device coupled to the memory controller. The memory controller may mirror a first set of data stored in a first block of memory of the memory device to a second block of memory of the memory device. The memory controller may also write the first copy of data to the first block of memory as a second copy of data. The memory controller send a first message to the processor indicating a memory fault error for the first block of memory.

13 Claims, 12 Drawing Sheets

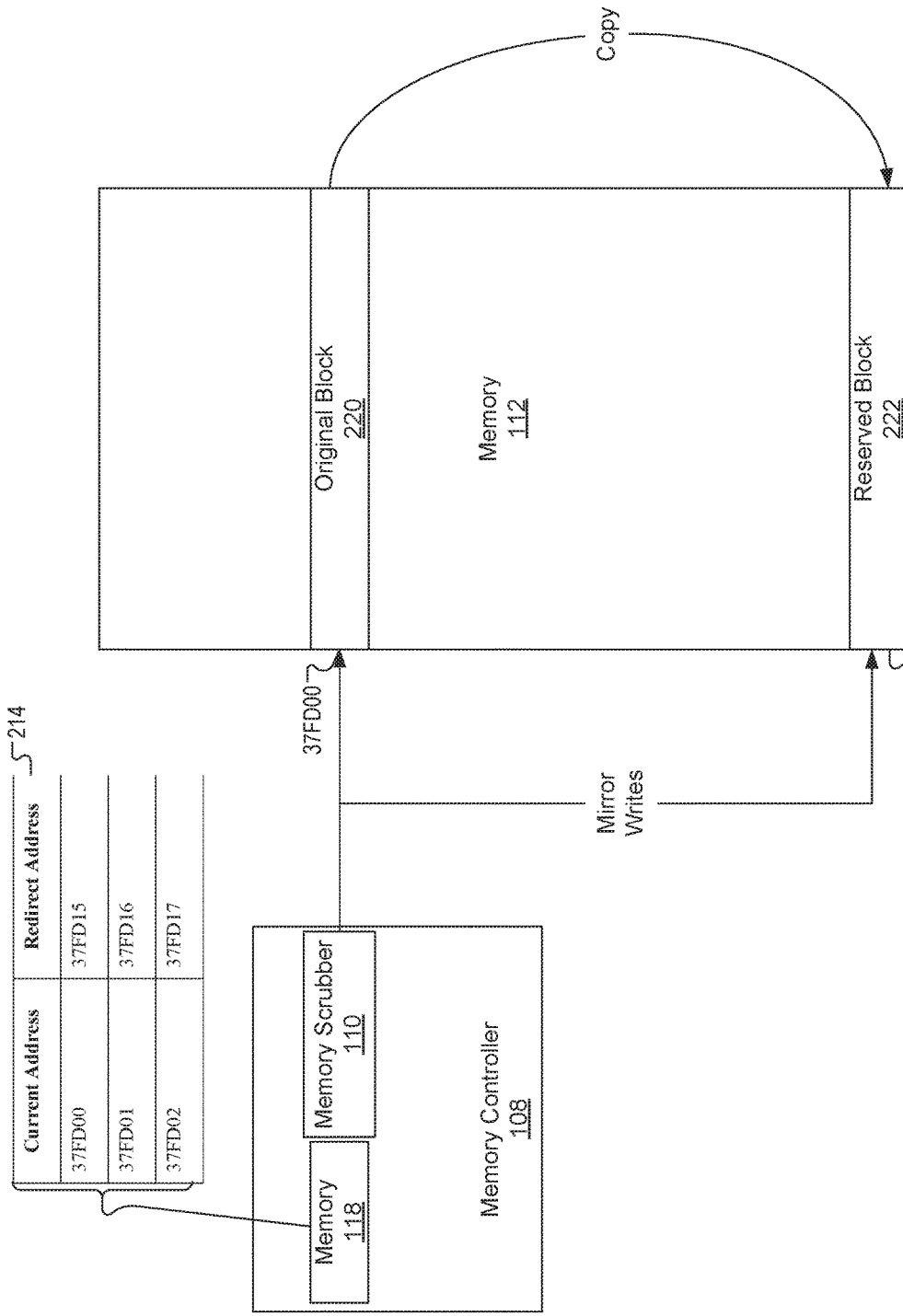

READ AND WRITE MEMORY SCRUBBER

BACKGROUND

Maintaining a reliable computer system with continuous availability may be mandatory for some computer systems or servers. To maintain the continuous availability, a system designer may build reliability, availability, serviceability, manageability (RASM) features to improve overall system reliability and availability. The RASM features may include various degrees of redundancy, error correction, error detection, and error containment techniques employed at different levels in the computer systems and servers.

BRIEF DESCRIPTION OF THE DRAWINGS

Various embodiments of the present invention will be understood more fully from the detailed description given below and from the accompanying drawings of various embodiments of the invention.

FIG. 2A illustrates the memory controller mirroring data from an original block of memory to a reserved block of memory according to one embodiment.

DESCRIPTION OF EMBODIMENTS

Figure 1:
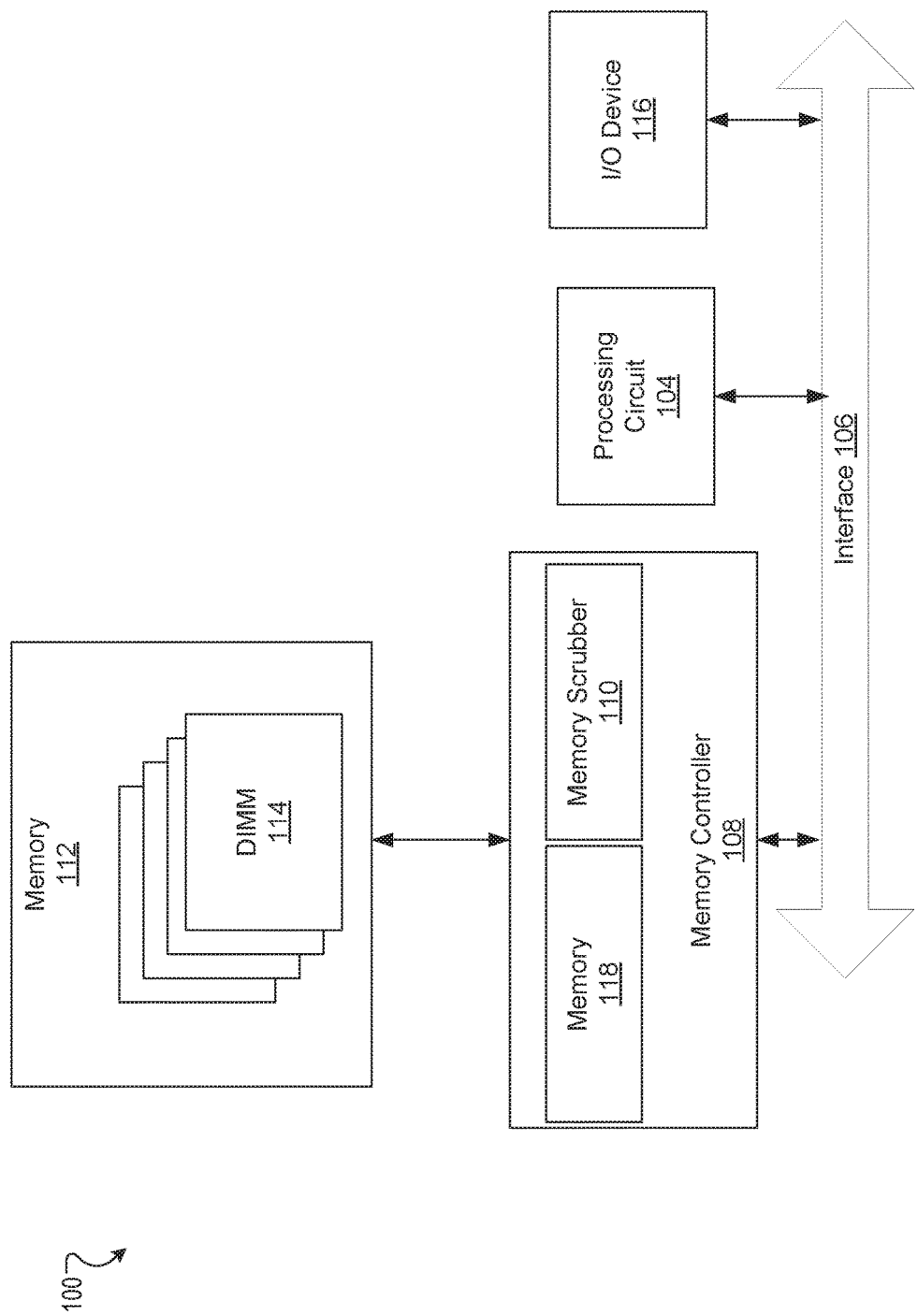
FIG. 1 is a block diagram illustrating a computing system that implements a memory controller with a memory scrubber to scrub a memory according to one embodiment.

Many computer system failures may be attributed to memory errors. Thermal stressing, age, power spikes, power supply issues, or row hammer hacking may cause memory components to degrade, fail to hold the correct data, and lead to memory fault errors. If the memory fault errors go undetected and uncorrected, the errors may cause a computing system to malfunction or crash. To avoid the errors, a memory controller of the computing system may use a memory scrubber to periodically scrub memory in the computing system to check for memory errors and failures.

The memory controller may be a circuit that manages the flow of data going to and from a memory. In one implementation, the memory controller may be an independent circuit or chip. In another implementation, the memory controller may be integrated into a processing device, such as integrated onto the same die a microprocessor. In one example, the memory controller may use a demand memory scrubber to detect errors at the block of memory when an application requests access to a block of memory. In another example, the memory controller may use a patrol memory scrubber to scan blocks of memory to detect errors independent of an application requesting access to a block of memory. In one implementation, the demand memory scrubber or the patrol memory scrubber may be a circuit coupled to a memory controller that performs a memory scrubbing operation. In another implementation, the demand memory scrubber or the patrol memory scrubber may be a program that scrubs blocks of memory and is executed on a processing circuit of the memory controller.

The patrol memory scrubber may periodically scrub the memory in a computing system to check for errors in the memory. For example, memory for relatively large servers may sit for weeks at a time without being accessed by an application. As the data sits without being accessed for long periods of time, neutron strikes may cause bits in the memory to flip and data to be lost. The patrol memory scrubber may iterate through blocks of memory and check for errors using error-correcting codes (ECCs) checksums. The ECCs include redundant data or parity data. A memory controller may use a checksum operation to compare the parity data to data stored at a block of memory. The memory controller may use the ECCs to recover data when a single bit error occurs in the storage or transmission of data to the block of memory. For example, a dual in-line memory module (DIMM) may store redundant information in the form of error correcting codes (ECCs) to correct a single bit error.

Conventionally, the patrol memory scrubber may only read data from blocks of memory when detecting bit errors in the memory to avoid a processor reading incorrect data from a block of memory being scrubbed by the patrol memory scrubber. For example, if a conventional patrol memory scrubber were to write data to a block of memory during a memory scrubbing operation to check for different types of memory fault errors and the processor reads the data from the block of memory, the processor would read incorrect data. The read-only nature of the conventional memory scrubber may cause the memory scrubber to miss developing problems relating to patterns of data other than the current contents of the block of memory. For example, a conventional memory scrubber may miss a bit being stuck as a 1 when the current contents of the memory block are 1 bits as a memory scrubber would correctly read that the stuck bit is storing a 1 bit even though there is an error in the memory.

The embodiments described herein may address the above-noted deficiencies by performing a memory scrubbing operation to write sets of data with different test data patterns to a block of memory. The memory scrubbing operation may use the different test data patterns to identify any memory fault errors for the block of memory. To perform the memory scrubbing operation while the block of memory may be actively accessed by a processor, a memory controller may use memory mirroring to copy the data in the block of memory to a new location in memory and redirect memory access to the new location while the memory scrubbing operation is being executed. The memory scrubbing operation may iteratively check blocks of memory for memory fault errors and report the memory fault errors to the processor.

FIG. 1 is a block diagram illustrating a computing system 100 that implements a memory controller 108 with a memory scrubber 110 to scrub a memory 112 according to one embodiment. The computing system 100 may include an input/output (I/O) device 114, and a memory 112. The memory controller 108, the processing circuit 104, and the I/O device 116 may be coupled to the interface 106. The memory 112 may be coupled to the memory controller 108

The I/O device 116 may be a network adapter, a modem, a wireless communication device, a touch screen device, a peripheral device, and so forth. The I/O device 116 may access the memory 112 via the memory controller 108. The processing circuit 104 may be coupled to an interface 106 to communicate with the memory controller 108 (also referred to as a memory control circuit). In one implementation, the processing circuit 104 may be a central processing unit (CPU) or a service processor dedicated to managing service functions in the computing system 100.

The computing system 100 may include the memory 112 (also referred to as a memory device or a memory circuit). In one implementation, the memory 112 may be an external memory device, such as an external hard drive or server, coupled to the memory controller 108. In another embodiment, the memory 112 may be an internal memory device, such as a cache or a main memory, that is integrated into the processing device. The memory 112 may store data in blocks of memory, such as a 64-bit block of memory. In one embodiment, the memory 112 may include dual in-line memory modules (DIMMs) 114. The DIMMs 114 may be banks of dynamic random access memories (DRAMs) with blocks of memory to store data.

The memory controller 108 coupled to the interface 106. Memory controller 108 may control the access of the processing circuit 104 to the memory 112 and may transfer data between the processing circuit 104 and the memory 112.

The memory controller 108 may include may detect and report errors in memory blocks at the memory 112. In one implementation, the memory controller 108 may include a memory error detector. In one example, the memory error detector may be a hardware circuit coupled to the memory controller 108. In another example, the memory error detector may be a program executing on a processor.

In another example, the memory controller 108 may include a memory scrubber 110 may detect and report errors in memory blocks at the memory 112. The memory scrubber 110 may be associated with the memory 112. The memory scrubber 110 may operate independent of the processing circuit 104 and operate in the background as the processor executes instructions for applications. The memory controller 108 or the memory scrubber 110 may include firmware or an application to determine addresses in the memory 112 to be scrubbed by the memory scrubber 110.

In one implementation, the memory controller 108 and the memory scrubber 110 may be applications executed on the processing circuit 104. In another implementation, the memory scrubber 110 may be an application executed on a processor of the memory controller 108, such as a service processor. In another implementation, the memory scrubber 110 may be a hardware component that is coupled to the memory controller 108 or integrated into the memory controller 108. As discussed below, the memory controller 108 may also include memory 118 that stores a table or map to indicate memory addresses in the memory 112 used to store data and redirect memory access during a memory scrubbing operation.

Figure 2B:
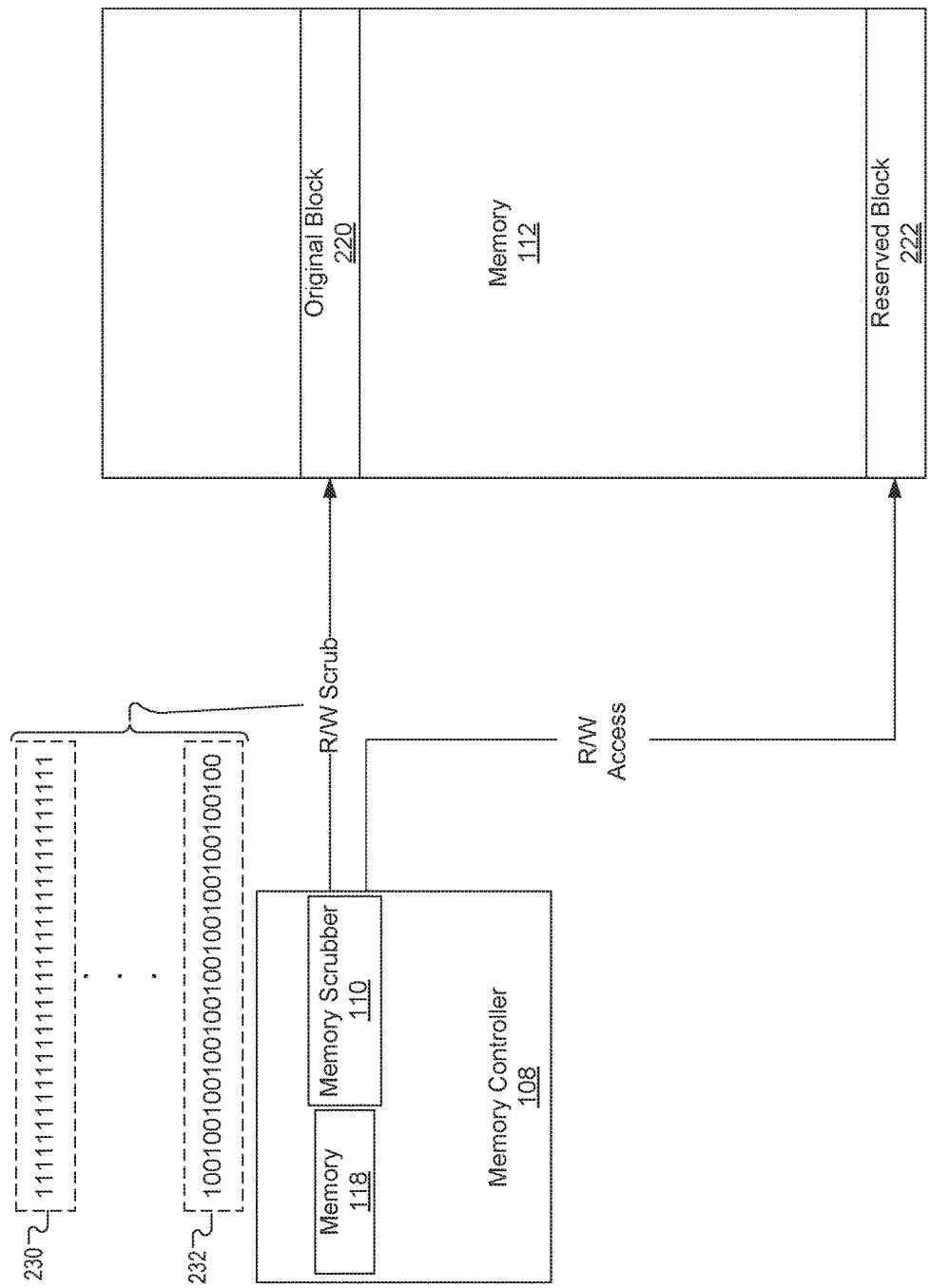
FIG. 2B illustrates the memory controller scrubbing the original block of memory according to one embodiment.
Figure 2C:
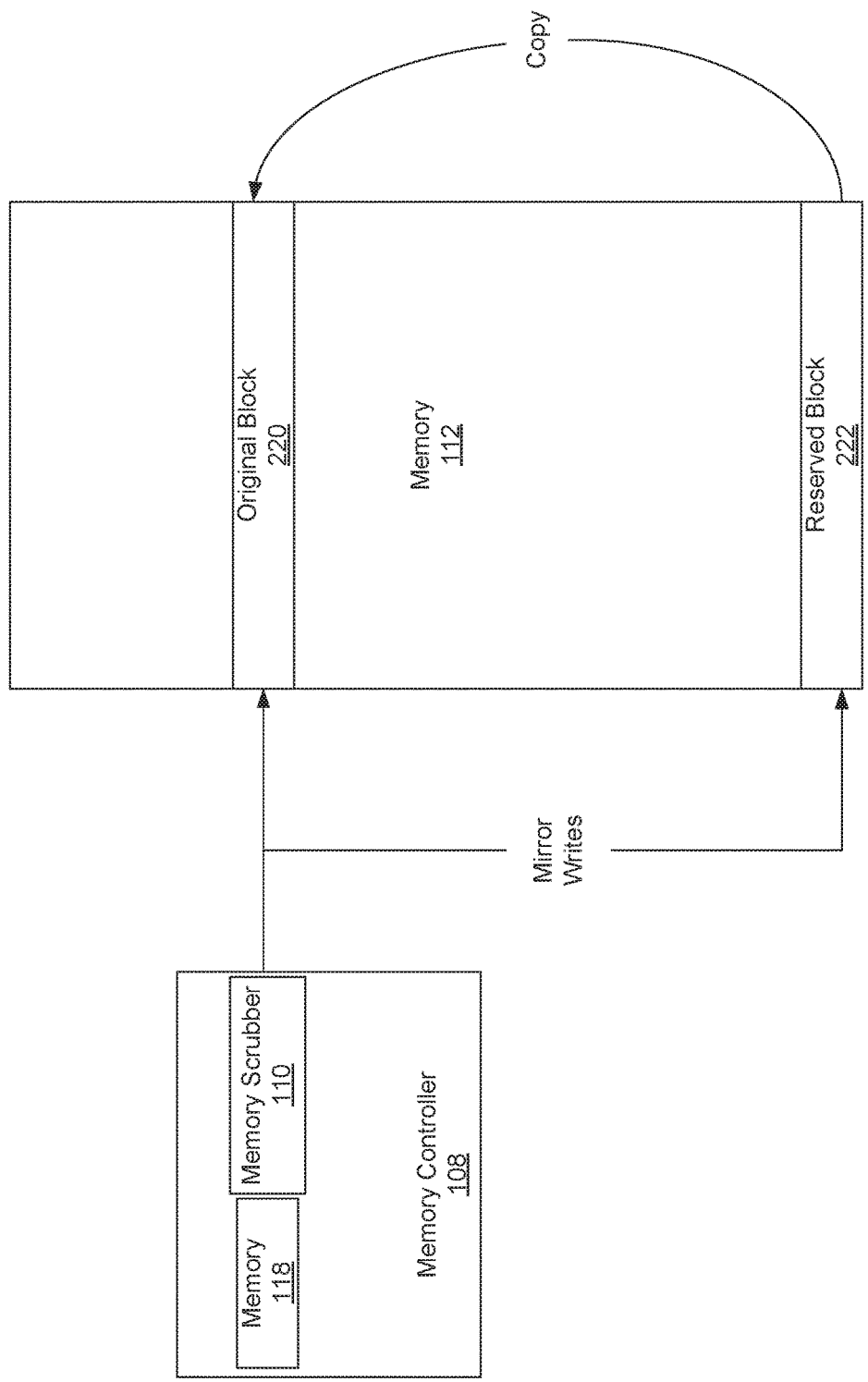
FIG. 2C illustrates the memory controller mirroring data from the reserved block of memory to the original block of memory according to one embodiment.

FIGS. 2A, 2B, and 2C illustrate steps to perform a memory scrubbing operation according to one embodiment. FIG. 2A illustrates the memory controller 108 mirroring data from an original block of memory 220 to a reserved block of memory 222 according to one embodiment. Some of the features in FIG. 2A are the same or similar to some of the features in FIG. 1 as noted by same reference numbers, unless expressly described otherwise.

The memory controller 108 may receive a request from a processor to perform a memory scrubbing operation. The memory scrubbing operation may include the memory controller 108 identifying an original block of memory 220 for the memory scrubbing operation. In one implementation, the memory controller 108 may randomly select the original block of memory 220 for the memory scrubbing operation. In another implementation, the request from the processor may include a memory address indicating the location in the memory 112 for the memory scrubbing operation. In another implementation, the memory controller 108 may select a first or lowest memory address in the memory 112 for the memory scrubbing operation. In another implementation, the memory controller may select a block of memory that is accessed less frequently than other blocks of memory in the memory 112.

The memory scrubbing operation may include the memory controller 108 mirroring the data stored at the original block of memory 220 to the reserved block of memory 222. The reserved block of memory 222 may be a block of memory designated as a location to mirror data to during the memory scrubbing operation. In one example, the reserved block of memory 222 may be a block of memory that is several megabytes in size (such as 1-10 megabytes) and includes one or more words. A word is a fixed sized group of bits that are handled as a unit by the instruction set and/or hardware of the processor. In one example, a word may be 64 bits in size.

The memory controller 108 may include a table 214 in the memory 118. The table 214 may include a first cell indicating a location in the memory 112 of the original block of memory 220 and a second cell indicating a location in the memory 112 of the reserved block of memory 222. The memory controller 108 may associate the first cell with the second cell for redirecting memory accesses. For example, the memory controller 108 may link a memory address of 37FD00 for the original block of memory 220 with a redirected memory address of 37FD15 for the reserved block of memory 222. When a memory access is to be redirected during the memory scrubbing operation, the memory access to the memory address of 37FD15 will be redirected to the memory address of 37FD15.

The mirroring of the data may include copying data stored at the original block of memory 220 to the reserved block of memory 222. When the memory controller 108 receives a request from the processor to write new data to the original block of memory 220 while the memory controller 108 is copying the original data to the reserved block of memory 222, the mirroring of the data may include writing the new data to the original block of memory 220 and the reserved block of memory 222. In one implementation, the new data may be written to the original block of memory 220 and the reserved block of memory 222 in parallel. In another implementation, the new data may be written to the original block of memory 220 and the reserved block of memory 222 sequentially.

The new data may be written to the original block of memory 220 such that when the processor reads data from the original block of memory 220 while the original data is being copied to the reserved block of memory 222, the processor will read the new data. The new data may also be written to the reserved block of memory 222 so that the data stored at the reserved block of memory 222 includes the new data. The new data may be written to both the original block of memory 220 and the reserved block of memory 222 so that a complete copy of the data at the original block of memory 220 includes the new data. Writing the new data to both the original block of memory 220 and the reserved block of memory 222 enables the processor and the memory 112 to continue to be accessed during the memory scrubbing operation.

When the memory controller 108 has completed the copy of the original data to the reserved block of memory 222, the memory controller 108 may redirect memory accesses for the original block of memory 220 to the reserved block of memory 222. In one implementation, to redirect the redirect memory accesses, the memory controller 108 may use the table 214 in the memory 118 to determine the memory location to redirect read or write requests for the original block of memory 220.

FIG. 2B illustrates the memory controller 108 scrubbing the original block of memory 220 according to one embodiment. Some of the features in FIG. 2B are the same or similar to some of the features in FIGS. 1 and 2A as noted by the same reference numbers, unless expressly described otherwise. When the data at the original block of memory 220 has been copied to the reserved block of memory 222, the memory scrubbing operation may include scrubbing the original block of memory 220. Scrubbing the original block of memory 220 may include copying sets of data having different test data patterns to the original block of memory 220. The sets of data may be predefined patterns of bits for testing different types of memory fault errors. In one implementation, a set of data may be 64 bits in a predefined pattern.

The memory fault errors may include stuck bits, leaking bits, bit leakage, and so forth. A stuck bit may be a bit that is stuck or unchangeable in the memory block because a transistor in the memory 112 may no longer hold its charge and may not be able to switch from a 1 bit to a 0 bit or vice versa. A leaked bit may be a bit that may not hold a correct value and may switch from a one to a zero or vice versa because a transistor in the memory 112 may no longer hold its charge. Bit leakage may be when a value of an original bit leaks to an adjacent bit because an electric charge for a transistor associated with the original bit leaks into an adjacent row of transistors for the adjacent bit. The leaked charge then causes the adjacent bit to switch from a 1 bit to a 0 bit or vice versa.

In one implementation, the memory scrubber 110 may make a copy of the first set of data 230 stored at the memory 118. In one example, the test data pattern of the first set of data 230 may be all 0 bits or all 1 bits. The memory scrubber 110 may write the copy of the first set of data 230 to the original block of memory 220. The memory scrubber 110 may then compare a test data pattern of the original first set of data 230 with a test data pattern of a copy of the first set of data 230 to determine whether there are any differences between the test data patterns.

In one implementation, when the test data pattern of the original first set of data 230 is the same as the test data pattern of the copy of the first set of data 230, the memory scrubber 110 may determine that there are no memory fault errors for the associated first set of data 230 at the original block of memory 220. In another implementation, when the test data pattern of the copy of the first set of data 230 is different than the test data pattern of the original first set of data, the memory scrubber 110 may determine that a memory fault error associated with the first set of data 230 has occurred at the original block of memory 220. In one implementation, the first set of data 230 may be the same size as the original block of memory 220. The memory scrubber may then check the bits of the original block of memory 220 with a single comparison. In another implementation, the original block of memory 220 may be broken into multiple words that are smaller in size than the original block of memory 220. For example, the original block of memory 220 may be 5 megabytes in size, each word may be 64 bits in size, and the first set of data 230 may be 64 bits in size. The memory scrubber 110 may write a copy of the first set of data 230 to the first word in the original block of memory 220, compare the copy of the first set of data 230 to the original first set of data 230, and determine if there is a memory fault error for the first word. The memory scrubber 110 may iteratively check the words of the first set of data 230 to determine if any of the words have memory fault errors.

In one implementation, when the memory fault error is detected, the memory controller 108 may send a memory fault message to the processor. In another implementation, when the memory fault error is detected, the memory controller 108 may send a memory fault message to a baseboard memory controller (BMC) of a server. In another implementation, when the memory fault error is detected, the memory controller 108 may send a memory fault message to a service processor of a server that handles memory faults. In another example, when the memory fault error is detected, the memory controller 108 may send a message to a device initiating a service call for a system administrator to fix or replace the memory.

In another example, the memory scrubber 110 may delay comparing the original set of data 230 with the copy of the set of data for a period of time to detect if there is memory leakage. For example, the memory scrubber 110 may write the copy of the original set of data 230 to the original block of memory 220. The memory scrubber 110 may then wait a period of time, such as 1-3 milliseconds or the length of time of a hardware refresh cycle for the computing system. After the memory scrubber 110 has waited for the period of time, the memory scrubber 110 may compare the test data pattern of the first set of data with the test data pattern of the copy of the first set of data.

The memory scrubber 110 may iteratively scrub the original block of memory 220 with additional sets of data, such as a second set of data 232 stored at the memory 118. To scrub the original block of memory 220 with the second set of data 232, the memory controller 108 may make a copy of the second set of data 232. The test data pattern of the second set of data 232 may be a sequence of 0 bits and 1 bits. The memory scrubber 110 may write the copy of the second set of data 232 to the original block of memory 220. The memory scrubber 110 may then compare a test data pattern of the original second set of data 230 with a test data pattern of a copy of the second set of data to determine whether there are any differences. As discussed above, when there are differences, the memory controller 108 may send out a memory fault message or a service call message, as discussed above. The memory 118 may store a variety of different sets of data having different test data patterns. The memory scrubber 110 may iteratively scrub the original block of memory 220 with the different sets of data to identify different memory fault errors.

In one example, when a bit of the original block of memory is stuck as a 1 bit and the first set of data has a test data pattern of all 1 bits, the memory scrubber 110 may not detect that the bit is stuck as a 1 bit because the original set of data and the copied set of data would be the same. In this example, when the memory scrubber 110 scrubs the original block of memory 220 with the second set of data, the memory scrubber 110 may detect the bit is stuck as a 1 bit because the test data pattern for the original set of data and the test data pattern for the copied set of data are different. While the memory scrubber 110 scrubs the original block of memory 220 with the different sets of data, the memory controller 108 may redirect memory accesses to the reserved block of memory 222 using the table 214. For example, when a processor sends a request to read the data stored at the original block of memory 220, the memory controller 108 may use the table 214 to determine that the data is to be read from the reserved block of memory 222. The memory controller may then send the data from the reserved block of memory 222 to the processor.

FIG. 2C illustrates the memory controller 108 mirroring data from the reserved block of memory 222 to the original block of memory 220 according to one embodiment. Some of the features in FIG. 2C are the same or similar to some of the features in FIGS. 1, 2A, and 2B as noted by same reference numbers, unless expressly described otherwise. When the memory scrubber 110 has completed scrubbed the original block of memory 220, the memory scrubbing operation may include mirroring the data from the reserved block of memory 222 to the original block of memory 220. The mirroring of the data may include copying the data stored at the reserved block of memory 222 to the original block of memory 220. In one implementation, when there is a memory fault error at the original block of memory 220, the memory controller may mirror the data to the original block of memory 220 to clear the reserved block of memory 222 for use in subsequent memory scrubbing operations.

When the memory controller 108 receives a request from the processor to write new data to the original block of memory 220 while the memory controller is copying the data from the original block of memory 220 to the original block of memory 220, the mirroring of the data may include writing the new data to the original block of memory 220 and the reserved block of memory 222 in parallel.

The new data may be written to the original block of memory 220 so that if the processor requests data from the original block of memory 220 while the data is being copied to the original block of memory 220, the processor will receive the new data. The new data may also be written to the reserved block of memory 222 so that the data stored at the reserved block of memory 222 includes the new data. When the memory controller 108 has completed the copy of the data from the reserved block of memory 222 to the original block of memory 220, the memory controller 108 may redirect memory accesses for the reserved block of memory 222 to the original block of memory 220. To redirect the memory accesses, the memory controller 108 may use the table 214 in the memory 118 to determine a memory location to read or write data. Where the data is mirrored between the original block of memory 220 and the reserved block of memory 222 and the memory accesses are redirected during the memory scrubbing operation, as discussed above, the memory 112 may be active and available for access while the memory controller 108 performs the memory scrubbing operation. In one example, while the memory controller 108 performs the memory scrubbing operation, a processor may read data from the memory 112 and write data to the memory 112. As the memory scrubbing operation may be performed in the background, memory accesses by the processor may be unaffected as the memory scrubber 110 scrubs the original block of memory 220.

In one implementation, the memory controller 108 may perform the memory scrubbing operation on multiple blocks of memory at the same time. For example, the memory 112 may include multiple reserved blocks of memory to receive mirrored copies of data from original blocks of memory. In another implementation, the computing system 100 may include multiple memory controllers that may scrub different blocks of memory simultaneous or in parallel. For example, the computing system 100 may include two memory controllers for each CPU socket in the computing system 100. In one example, both of the memory controllers may perform memory scrubbing operations in parallel. In another example, both of the memory controllers may perform memory scrubbing operations independent of each other.

Figure 3:
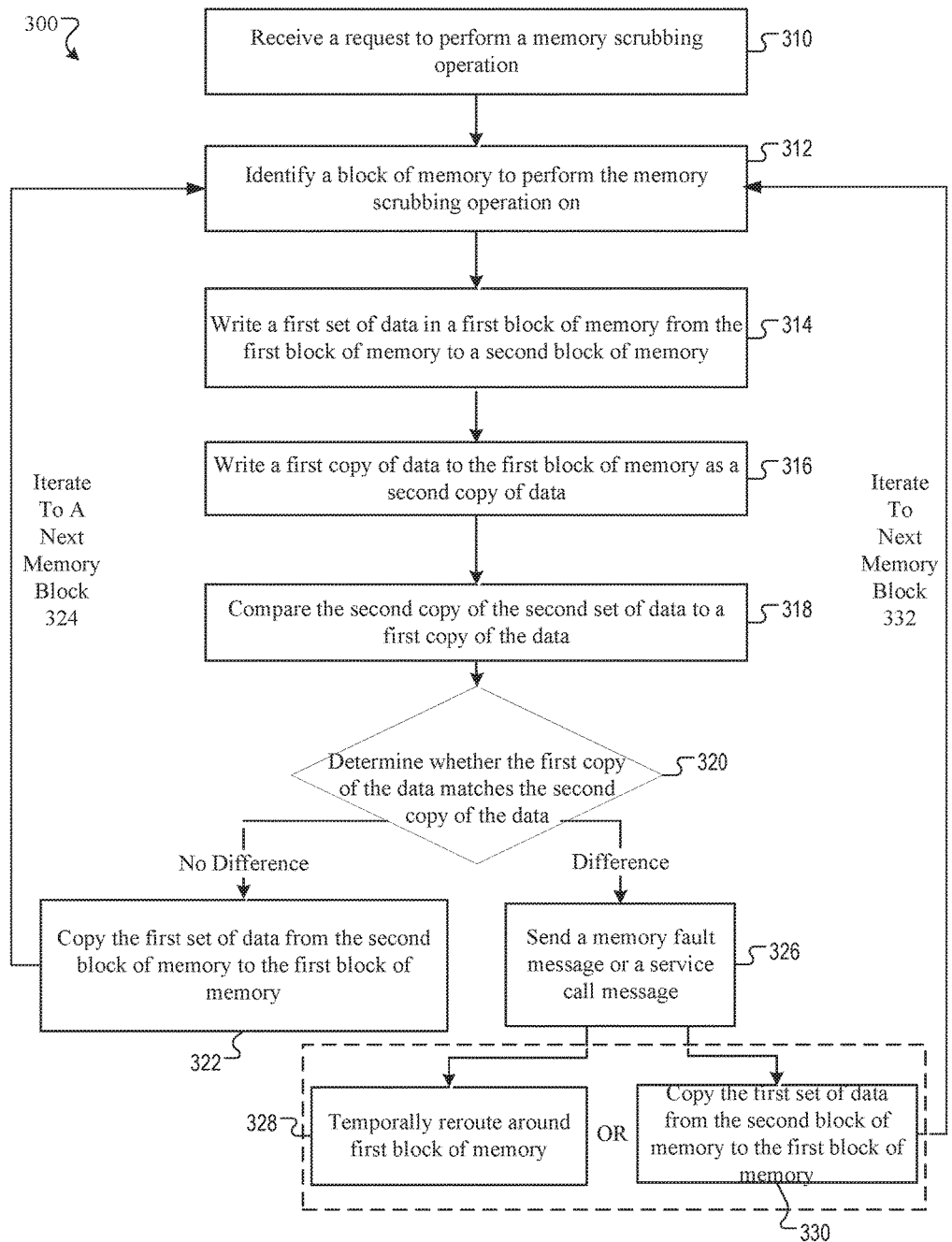
FIG. 3 illustrates a flowchart of a method for scrubbing an original block of memory according to one embodiment.

FIG. 3 illustrates a flowchart of a method 300 for scrubbing an original block of memory according to one embodiment. The method 300 may at least partially be performed by processing logic that includes hardware (e.g., circuitry, dedicated logic, programmable logic, microcode, etc.), software (e.g., instructions executed by a processing device), firmware or a combination thereof. In one embodiment, the method 300 may be performed by all or part of the computing system 100 of FIG. 1. For example, the method 300 may be performed by the memory controller 108, the processing circuit 104, or the memory scrubber 110.

Referring to FIG. 3, the method 300 begins with a memory controller receiving a request to perform a memory scrubbing operation (block 310). The method may include the memory controller identifying a block of memory to perform the memory scrubbing operation on (block 312). The method may include the memory controller copying a first set of data in a first block of memory of a memory device from the first block of memory to a second block of memory (block 314). When the memory controller receives a request from the processor to write new data to the original block of memory while the memory controller is copying the original data to the reserved block of memory, the memory controller may write the new data to the original block of memory and the reserved block of memory. In one implementation, the new data may be written to the original block of memory and the reserved block of memory in parallel. In another implementation, the new data may be written to the original block of memory and the reserved block of memory sequentially.

The method may include a memory scrubber of the memory controller writing a first copy of data to the first block of memory as a second copy of data (block 316).

The method may include the memory scrubber comparing the second copy of the second set of data to a first copy of the data (block 318). The method may include the memory scrubber determining whether a test data pattern of the first copy of the data matches a test data pattern of the second copy of the data (320). The method may include copying the first set of data from the second block of memory to the first block of memory when the test data pattern of the first copy of the data matches a test data pattern of the second copy of the data (block 322). The method may include the memory controller iteratively performing a memory scrubbing operation on another block of memory (block 324). For example, the memory controller may include performing a memory scrubbing operation on a next sequential block of memory in a memory device.

The method may include the memory controller sending a memory fault message or a service call message to a processor or BMC (block 326). In one implementation, the method may include the memory controller temporally rerouting data stored at the first block of memory to another block of memory at a memory device (block 328). In one example, the memory controller may identify another block of memory at the memory device to write data originally intended to be written to the first block of memory. In another example, the memory controller may skip over the first memory block when writing data to the memory device. In another example, the memory controller may shut down the memory device or a portion of the memory device that includes the first block of memory until the memory fault error may be fixed or the memory replaced. In another implementation, the method may include copying the first set of data from the second block of memory to the first block of memory (block 330). The method may include iteratively checking another block of memory when the first set of data has been copied to the first block of memory (block 332).

Figure 4:
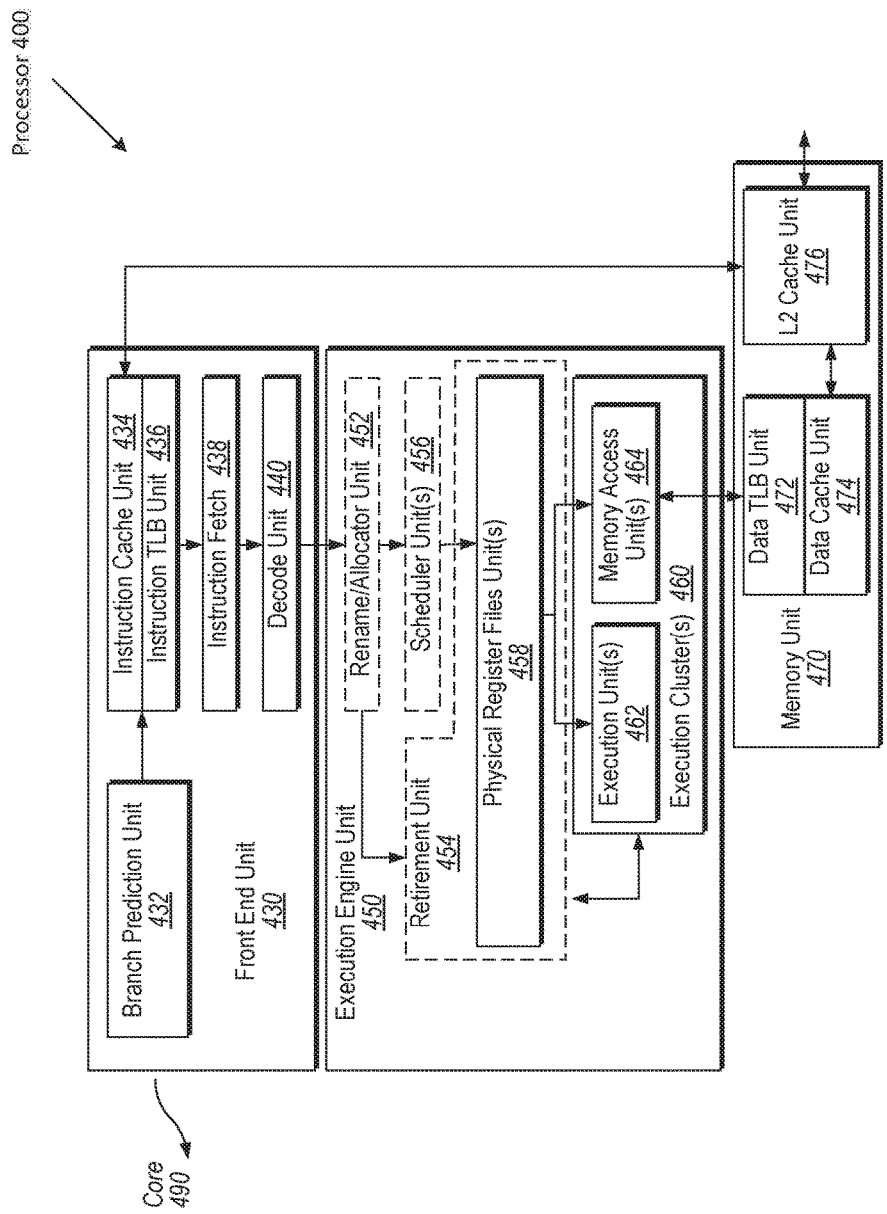
FIG. 4 is a block diagram illustrating a micro-architecture for a processor of FIG. 1, according to one embodiment.

FIG. 4 is a block diagram illustrating a micro-architecture for a processor 400 that implements the computing system 100 according to one embodiment. Specifically, processor 400 depicts an in-order architecture core and a register renaming logic, out-of-order issue/execution logic to be included in a processor according to at least one embodiment of the disclosure. The embodiments of the computing system 100 may be implemented in processor 400.

Processor 400 includes a front end unit 430 coupled to an execution engine unit 450, and both are coupled to a memory unit 470. The processor 400 may include a core 490 that is a reduced instruction set computing (RISC) core, a complex instruction set computing (CISC) core, a very long instruction word (VLIW) core, or a hybrid or alternative core type. As yet another option, processor 400 may include a special-purpose core, such as, for example, a network or communication core, compression engine, graphics core, or the like. In another embodiment, the core 490 may have five stages.

The front end unit 430 includes a branch prediction unit 432 coupled to an instruction cache unit 434, which is coupled to an instruction translation lookaside buffer (TLB) unit 436, which is coupled to an instruction fetch unit 438, which is coupled to a decode unit 440. The decode unit 440 (also known as a decoder) may decode instructions, and generate as an output one or more micro-operations, microcode entry points, microinstructions, other instructions, or other control signals, which are decoded from, or which otherwise reflect, or are derived from, the original instructions. The decode unit 440 may be implemented using various different mechanisms. Examples of suitable mechanisms include, but are not limited to, look-up tables, hardware implementations, programmable logic arrays (PLAs), microcode read only memories (ROMs), etc. The instruction cache unit 434 is further coupled to the memory unit 470. The decode unit 440 is coupled to a rename/allocator unit 452 in the execution engine unit 450.

The execution engine unit 450 includes the rename/allocator unit 452 coupled to a retirement unit 454 and a set of one or more scheduler unit(s) 456. The scheduler unit(s) 456 represents any number of different schedulers, including reservations stations (RS), central instruction window, etc. The scheduler unit(s) 456 is coupled to the physical register file(s) unit(s) 458. Each of the physical register file(s) units 458 represents one or more physical register files, different ones of which store one or more different data types, such as scalar integer, scalar floating point, packed integer, packed floating point, vector integer, vector floating point, etc., status (e.g., an instruction pointer that is the address of the next instruction to be executed), etc. The physical register file(s) unit(s) 458 is overlapped by the retirement unit 454 to illustrate various ways in which register renaming and out-of-order execution may be implemented (e.g., using a reorder buffer(s) and a retirement register file(s), using a future file(s), a history buffer(s), and a retirement register file(s); using a register maps and a pool of registers; etc.).

Generally, the architectural registers are visible from the outside of the processor or from a programmer's perspective. The registers are not limited to any known particular type of circuit. Various different types of registers are suitable as long as they are capable of storing and providing data as described herein. Examples of suitable registers include, but are not limited to, dedicated physical registers, dynamically allocated physical registers using register renaming, combinations of dedicated and dynamically allocated physical registers, etc. The retirement unit 454 and the physical register file(s) unit(s) 458 are coupled to the execution cluster(s) 460. The execution cluster(s) 460 includes a set of one or more execution units 462 and a set of one or more memory access units 464. The execution units 462 may perform various operations (e.g., shifts, addition, subtraction, multiplication) and operate on various types of data (e.g., scalar floating point, packed integer, packed floating point, vector integer, vector floating point).

While some embodiments may include a number of execution units dedicated to specific functions or sets of functions, other embodiments may include only one execution unit or multiple execution units that all perform all functions. The scheduler unit(s) 456, physical register file(s) unit(s) 458, and execution cluster(s) 460 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 464). It should also be understood that where separate pipelines are used, one or more of these pipelines may be out-of-order issue/execution and the rest in order.

The set of memory access units 464 is coupled to the memory unit 470, which may include a data prefetcher, a data TLB unit 472, a data cache unit (DCU) 474, and a level 2 (L2) cache unit 476, to name a few examples. In some embodiments, DCU 474 is also known as a first level data cache (L1 cache). The DCU 474 may handle multiple outstanding cache misses and continue to service incoming stores and loads. It also supports maintaining cache coherency. The data TLB unit 472 is a cache used to improve virtual address translation speed by mapping virtual and physical address spaces. In one exemplary embodiment, the memory access units 464 may include a load unit, a store address unit, and a store data unit, each of which is coupled to the data TLB unit 472 in the memory unit 470. The L2 cache unit 476 may be coupled to one or more other levels of cache and eventually to the main memory.

In one embodiment, the data prefetcher speculatively loads/prefetches data to the DCU 474 by automatically predicting which data a program is about to consume. Prefetching may refer to transferring data stored in one memory location (e.g., position) of a memory hierarchy (e.g., lower level caches or memory) to a higher-level memory location that is closer (e.g., yields lower access latency) to the processor before the data is actually demanded by the processor. More specifically, prefetching may refer to the early retrieval of data from one of the lower level caches/memory to a data cache and/or prefetch buffer before the processor issues a demand for the specific data being returned.

The processor 400 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.).

It should be understood that the core may not support multithreading (e.g., executing two or more parallel sets of operations or threads, time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology)).

While register renaming is described in the context of out-of-order execution, it should be understood that register renaming may be used in an in-order architecture. While the illustrated embodiment of the processor also includes a separate instruction and data cache units and a shared L2 cache unit, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor. In one implementation, a unit may be a circuit or a hardware component.

Figure 5:
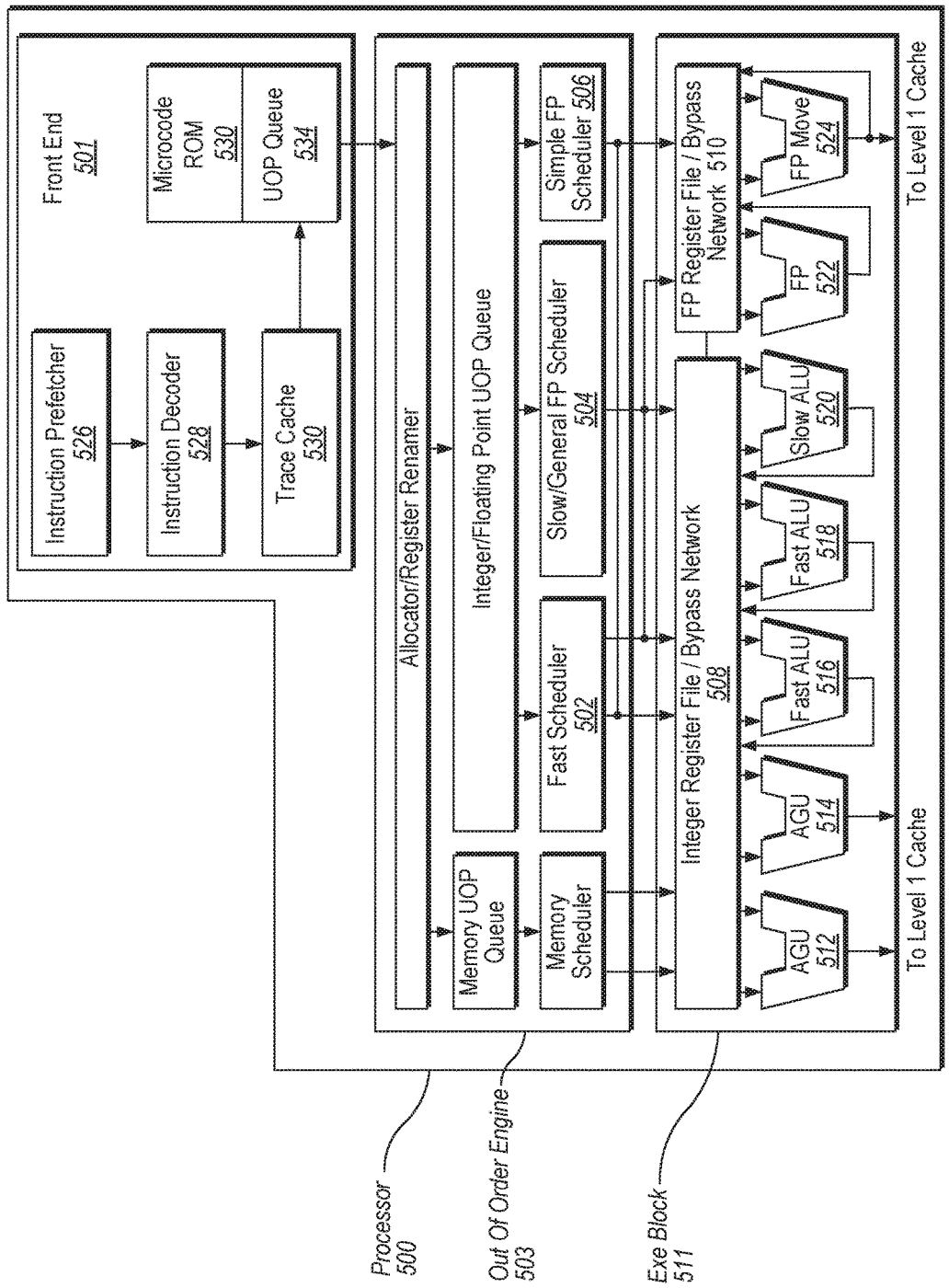
FIG. 5 illustrates a block diagram of the micro-architecture for a processor that includes logic circuits to perform access control, according to one embodiment.

FIG. 5 illustrates a block diagram of the micro-architecture for a processor 500 that includes logic circuits to perform access control according to one embodiment. In one embodiment, processor 500 is the processing circuit 104 of FIG. 1.

In some embodiments, an instruction in accordance with one embodiment may be implemented to operate on data elements having sizes of byte, word, doubleword, quadword, etc., as well as datatypes, such as single and double precision integer and floating point datatypes. In one embodiment the in-order front end 501 is the part of the processor 500 that fetches instructions to be executed and prepares them to be used later in the processor pipeline. The embodiments of the computing system 100 may be implemented in processor 500.

The front end 501 may include several units. In one embodiment, the instruction prefetcher 526 fetches instructions from memory and feeds them to an instruction decoder 528 which in turn decodes or interprets them. For example, in one embodiment, the decoder decodes a received instruction into one or more operations called "micro-instructions" or "micro-operations" (also called micro-op or uops) that the machine may execute. In other embodiments, the decoder parses the instruction into an opcode and corresponding data and control fields that are used by the micro-architecture to perform operations in accordance with one embodiment. In one embodiment, the trace cache 530 takes decoded uops and assembles them into program ordered sequences or traces in the uop queue 534 for execution. When the trace cache 530 encounters a complex instruction, the microcode ROM 532 provides the uops needed to complete the operation.

Some instructions are converted into a single micro-op, whereas others need several micro-ops to complete the full operation. In one embodiment, if more than four micro-ops are needed to complete an instruction, the decoder 518 accesses the microcode ROM 532 to do the instruction. For one embodiment, an instruction may be decoded into a small number of micro-ops for processing at the instruction decoder 518. In another embodiment, an instruction may be stored within the microcode ROM 532 should a number of micro-ops be needed to accomplish the operation. The trace cache 530 refers to an entry point programmable logic array (PLA) to determine a correct micro-instruction pointer for reading the micro-code sequences to complete one or more instructions in accordance with one embodiment from the micro-code ROM 532. After the micro-code, ROM 532 finishes sequencing micro-ops for an instruction, the front end 501 of the machine resumes fetching micro-ops from the trace cache 530.

The out-of-order execution engine 503 is where the instructions are prepared for execution. The out-of-order execution logic has a number of buffers to smooth out and re-order the flow of instructions to optimize performance as they go down the pipeline and get scheduled for execution. The allocator logic allocates the machine buffers and resources that each uop needs in order to execute. The register renaming logic renames logic registers onto entries in a register file. The allocator also allocates an entry for each uop in one of the two uop queues, one for memory operations and one for non-memory operations, in front of the instruction schedulers: memory scheduler, fast scheduler 502, slow/general floating point scheduler 504, and simple floating point scheduler 506. The uop schedulers 502, 504, 506, determine when a uop is ready to execute based on the readiness of their dependent input register operand sources and the availability of the execution resources the uops need to complete their operation. The fast scheduler 502 of one embodiment may schedule on each half of the main clock cycle while the other schedulers may only schedule once per main processor clock cycle. The schedulers arbitrate for the dispatch ports to schedule uops for execution.

Register files 508, 510, sit between the schedulers 502, 504, 506, and the execution units 512, 514, 516, 518, 520, 522, 524 in the execution block 511. There is a separate register file 508, 510, for integer and floating point operations, respectively. Each register file 508, 510, of one embodiment also includes a bypass network that may bypass or forward just completed results that have not yet been written into the register file to new dependent uops. The integer register file 508 and the floating point register file 510 are also capable of communicating data with the other. For one embodiment, the integer register file 508 is split into two separate register files, one register file for the low order 32 bits of data and a second register file for the high order 32 bits of data. The floating point register file 510 of one embodiment has 128 bit wide entries because floating point instructions typically have operands from 64 to 128 bits in width.

The execution block 511 contains the execution units 512, 514, 516, 518, 520, 522, 524, where the instructions are actually executed. This section includes the register files 508, 510, that store the integer and floating point data operand values that the micro-instructions need to execute. The processor 500 of one embodiment is comprised of a number of execution units: address generation unit (AGU) 512, AGU 514, fast ALU 516, fast ALU 518, slow ALU 520, floating point ALU 522, floating point move unit 524. For one embodiment, the floating point execution blocks 522, 524, execute floating point, MMX, SIMD, and SSE, or other operations. The floating point ALU 522 of one embodiment includes a 64-bit by 64-bit floating point divider to execute divide, square root, and remainder micro-ops. For embodiments of the present disclosure, instructions involving a floating point value may be handled with the floating point hardware.

In one embodiment, the ALU operations go to the high-speed ALU execution units 516, 518. The fast ALUs 516, 518, of one embodiment may execute fast operations with an effective latency of half a clock cycle. For one embodiment, most complex integer operations go to the slow ALU 520 as the slow ALU 520 includes integer execution hardware for long latency type of operations, such as a multiplier, shifts, flag logic, and branch processing. Memory load/store operations are executed by the AGUs 512, 514. For one embodiment, the integer ALUs 516, 518, 520, are described in the context of performing integer operations on 64-bit data operands. In alternative embodiments, the ALUs 516, 518, 520, may be implemented to support a variety of data bits including 16, 32, 128, 256, etc. Similarly, the floating point units 522, 524, may be implemented to support a range of operands having bits of various widths. For one embodiment, the floating point units 522, 524, may operate on 128 bits wide packed data operands in conjunction with SIMD and multimedia instructions.

In one embodiment, the uops schedulers 502, 504, 506, dispatch dependent operations before the parent load has finished executing. As uops are speculatively scheduled and executed in processor 500, the processor 500 also includes logic to handle memory misses. If a data load misses in the data cache, there may be dependent operations in flight in the pipeline that have left the scheduler with temporarily incorrect data. A replay mechanism tracks and re-executes instructions that use incorrect data. Only the dependent operations need to be replayed and the independent ones are allowed to complete. The schedulers and replay mechanism of one embodiment of a processor are also designed to catch instruction sequences for text string comparison operations.

The processor 500 also includes logic to implement access control according to one embodiment. In one embodiment, the execution block 511 of processor 500 may include PEL, to perform access control according to the description herein.

The term "registers" may refer to the on-board processor storage locations that are used as part of instructions to identify operands. In other words, registers may be those that are usable from the outside of the processor (from a programmer's perspective). However, the registers of an embodiment should not be limited in meaning to a particular type of circuit. Rather, a register of an embodiment is capable of storing and providing data, and performing the functions described herein. The registers described herein may be implemented by circuitry within a processor using any number of different techniques, such as dedicated physical registers, dynamically allocated physical registers using register renaming, combinations of dedicated and dynamically allocated physical registers, etc. In one embodiment, integer registers store thirty-two bit integer data. A register file of one embodiment also contains eight multimedia SIMD registers for packed data.

For the discussions herein, the registers are understood to be data registers designed to hold packed data, such as 64 bits wide MMX™ registers (also referred to as 'mm' registers in some instances) in microprocessors enabled with MMX technology from Intel Corporation of Santa Clara, Calif. These MMX registers, available in both integer and floating point forms, may operate with packed data elements that accompany SIMD and SSE instructions. Similarly, 128 bits wide XMM registers relating to SSE2, SSE3, SSE4, or beyond (referred to generically as "SSEx") technology may also be used to hold such packed data operands. In one embodiment, in storing packed data and integer data, the registers do not need to differentiate between the two data types. In one embodiment, integer and floating point are either contained in the same register file or different register files. Furthermore, in one embodiment, floating point and integer data may be stored in different registers or the same registers.

Figure 6:
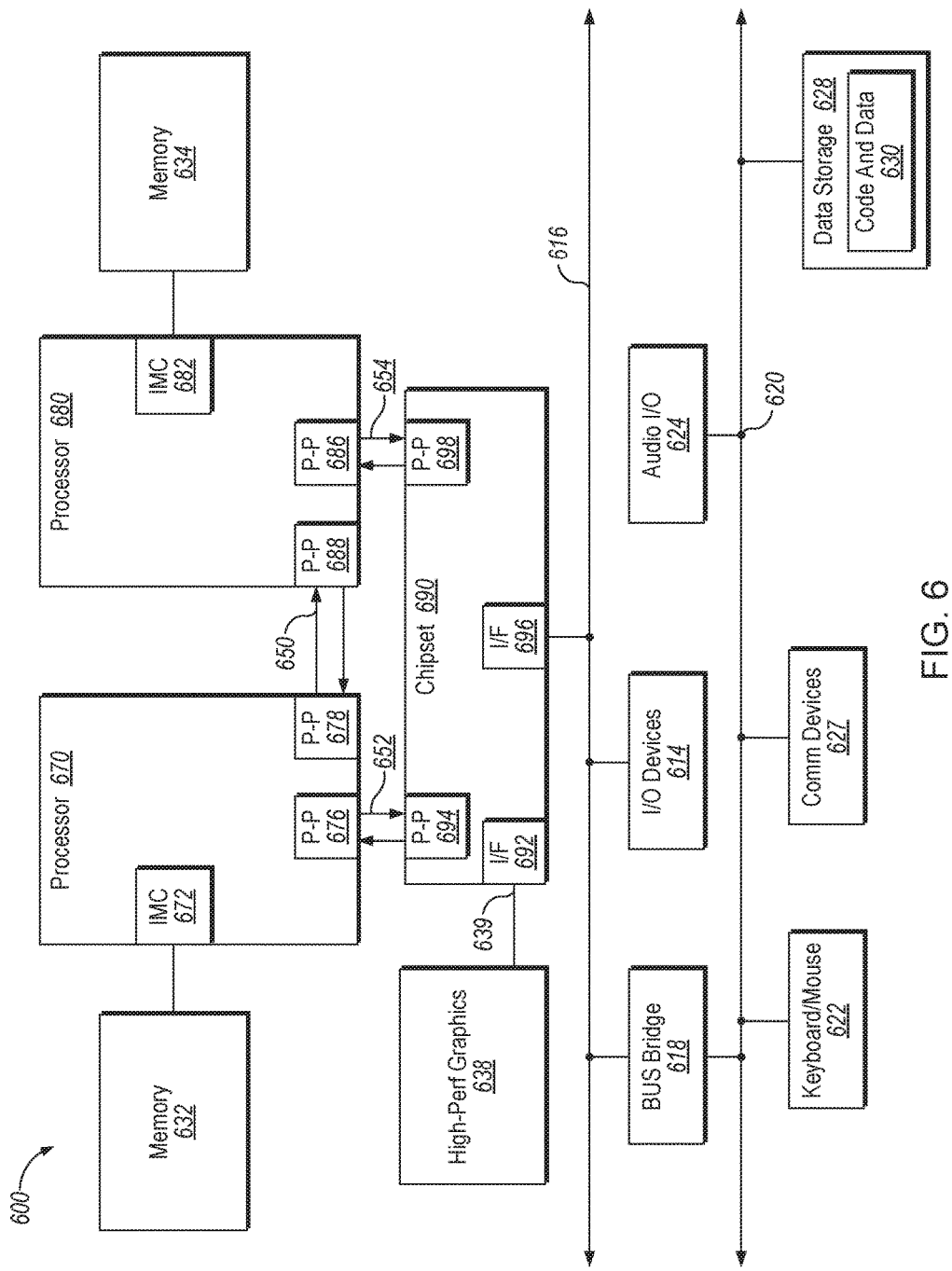
FIG. 6 is a block diagram of a computing system according to one implementation.

Embodiments may be implemented in many different system types. Referring now to FIG. 6, shown is a block diagram of a multiprocessor system 600 in accordance with an implementation. As shown in FIG. 6, multiprocessor system 600 is a point-to-point interconnect system and includes a first processor 670 and a second processor 680 coupled via a point-to-point interconnect 650. As shown in FIG. 6, each of processors 670 and 680 may be multicore processors, including first and second processor cores (i.e., processor cores 674a and 674b and processor cores 684a and 684b), although potentially many more cores may be present in the processors. The processors each may include hybrid write mode logics in accordance with an embodiment of the present. The embodiments of the computing system 100 may be implemented in the processor 670, processor 680, or both.

While shown with two processors 670, 680, it is to be understood that the scope of the present disclosure is not so limited. In other implementations, one or more additional processors may be present in a given processor.

Processors 670 and 680 are shown including integrated memory controller units 682 and 682, respectively. Processor 670 also includes as part of its bus controller units point-to-point (P-P) interfaces 676 and 688; similarly, second processor 680 includes P-P interfaces 686 and 688. Processors 670, 680 may exchange information via a point-to-point (P-P) interface 650 using P-P interface circuits 686, 688. As shown in FIG. 6, IMCs 682 and 682 couple the processors to respective memories, namely a memory 632 and a memory 634, which may be portions of main memory locally attached to the respective processors.

Processors 670, 680 may each exchange information with a chipset 690 via individual P-P interfaces 652, 654 using point to point interface circuits 676, 694, 686, 698. Chipset 690 may also exchange information with a high-performance graphics circuit 638 via a high-performance graphics interface 639.

A shared cache (not shown) may be included in either processor or outside of both processors, yet connected with the processors via P-P interconnect, such that either or both processors' local cache information may be stored in the shared cache if a processor is placed into a low power mode.

Chipset 690 may be coupled to a first bus 616 via an interface 696. In one embodiment, the first bus 616 may be a Peripheral Component Interconnect (PCI) bus, or a bus such as a PCI Express bus or another third generation I/O interconnect bus, although the scope of the present disclosure is not so limited.

As shown in FIG. 6, various I/O devices 614 may be coupled to first bus 616, along with a bus bridge 618 which couples first bus 616 to a second bus 620. In one embodiment, second bus 620 may be a low pin count (LPC) bus. Various devices may be coupled to second bus 620 including, for example, a keyboard and/or mouse 622, communication devices 627 and a storage unit 628 such as a disk drive or other mass storage device which may include instructions/code and data 630, in one embodiment. Further, an audio I/O 624 may be coupled to second bus 620. Note that other architectures are possible. For example, instead of the point-to-point architecture of FIG. 6, a system may implement a multi-drop bus or other such architecture.

Figure 7:
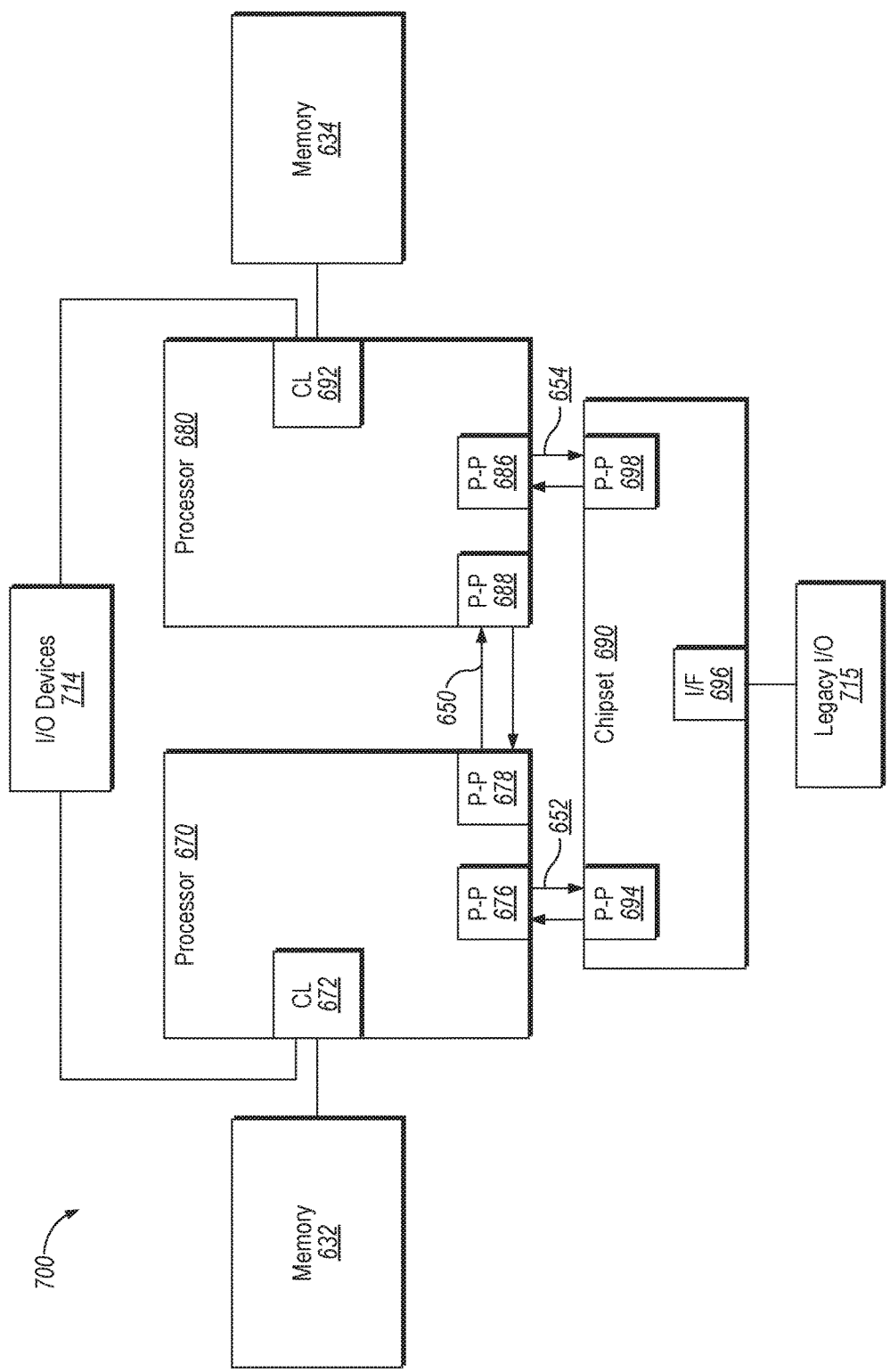
FIG. 7 is a block diagram of a computing system according to another implementation.

Referring now to FIG. 7, shown is a block diagram of a third system 700 in accordance with an embodiment of the present disclosure. Like elements in FIGS. 6 and 7 bear like reference numerals and certain aspects of FIG. 6 have been omitted from FIG. 7 in order to avoid obscuring other aspects of FIG. 7.

FIG. 7 illustrates that the processors 670, 680 may include integrated memory and I/O control logic ("CL") 672 and 682, respectively. For at least one embodiment, the CL 672, 682 may include integrated memory controller units such as described herein. In addition. CL 672, 682 may also include I/O control logic. FIG. 7 illustrates that the memories 632, 634 are coupled to the CL 672, 682, and that I/O devices 714 are also coupled to the control logic 672, 682. Legacy I/O devices 715 are coupled to the chipset 690. The embodiments of the computing system 100 may be implemented in processor 670, processor 680, or both.

Figure 8:
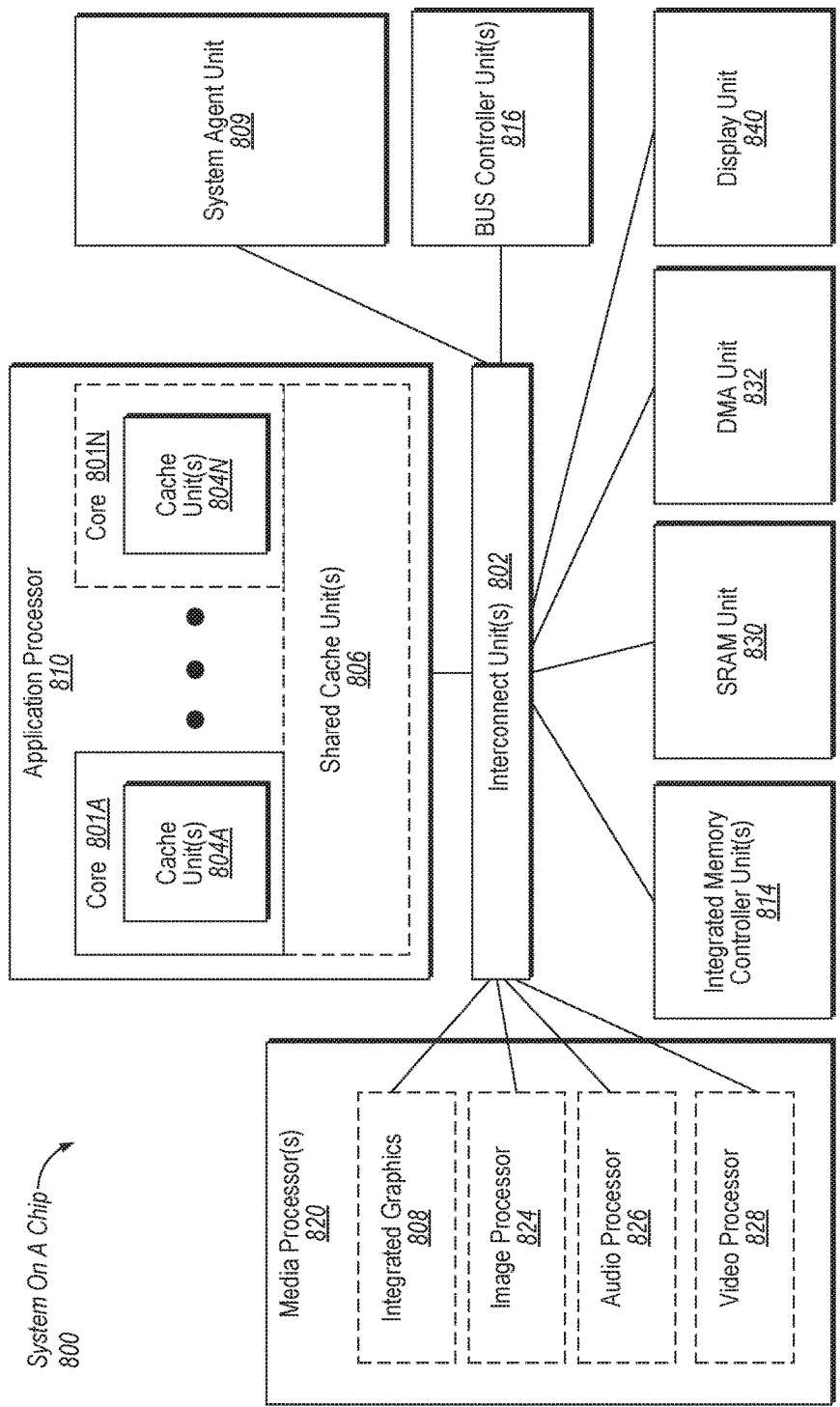
FIG. 8 is a block diagram of a system-on-a-chip according to one implementation.

FIG. 8 is an exemplary system on a chip (SoC) that may include one or more of the cores 801. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, handheld devices, and various other electronic devices, are also suitable. In general, a huge variety of systems or electronic devices capable of incorporating a processor and/or other execution logic as disclosed herein are generally suitable.

Referring now to FIG. 8, shown is a block diagram of a SoC 800 in accordance with an embodiment of the present disclosure. Also, dashed lined boxes are features on more advanced SoCs. In FIG. 8, an interconnect unit(s) 802 is coupled to: an application processor 810 which includes a set of one or more cores 801A-N and shared cache unit(s) 806; a system agent unit 809; a bus controller unit(s) 816; an integrated memory controller unit(s) 814; a set or one or more media processors 820 which may include integrated graphics logic 808, an image processor 824 for providing still and/or video camera functionality, an audio processor 826 for providing hardware audio acceleration, and a video processor 828 for providing video encode/decode acceleration; a static random access memory (SRAM) unit 830; a direct memory access (DMA) unit 832; and a display unit 840 for coupling to one or more external displays. The embodiments of the pages additions and content copying may be implemented in SoC 800.

Figure 9:
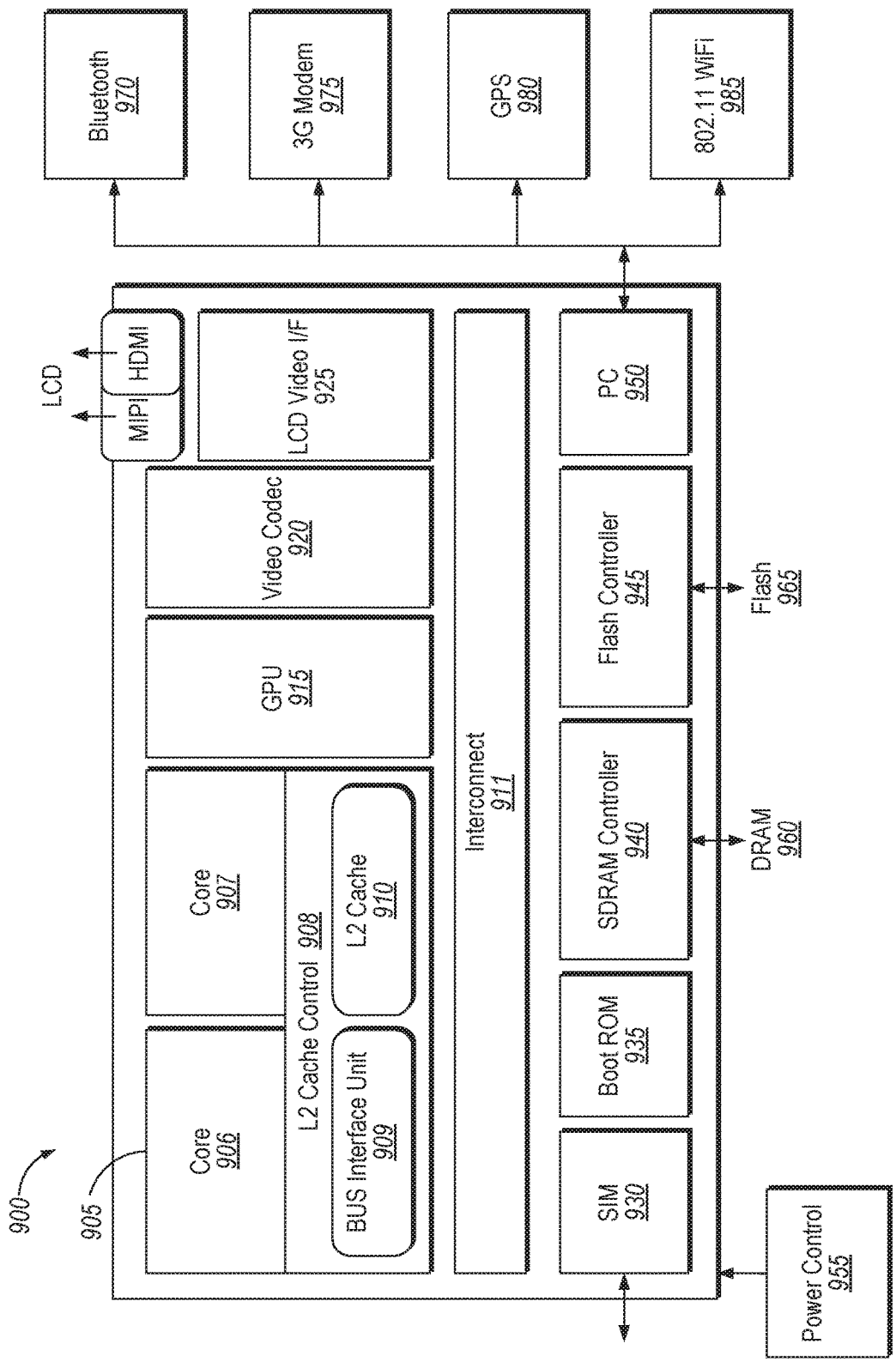
FIG. 9 illustrates another implementation of a block diagram of a computing system.

Turning next to FIG. 9, an embodiment of a system-on-a-chip (SoC) design in accordance with embodiments of the disclosure is depicted. As an illustrative example, SoC 900 is included in user equipment (UE). In one embodiment, UE refers to any device to be used by an end-user to communicate, such as a hand-held phone, smartphone, tablet, ultra-thin notebook, notebook with broadband adapter, or any other similar communication device. A UE may connect to a base station or node, which may correspond in nature to a mobile station (MS) in a GSM network. The embodiments of the computing system 100 may be implemented in SoC 900.

Here, SoC 900 includes 2 cores—906 and 907. Similar to the discussion above, cores 906 and 907 may conform to an Instruction Set Architecture, such as a processor having the Intel® Architecture Core™, an Advanced Micro Devices, Inc. (AMD) processor, an MIPS-based processor, an ARM-based processor design, or a customer thereof, as well as their licensees or adopters. Cores 906 and 907 are coupled to cache control 908 that is associated with bus interface unit 909 and L2 cache 910 to communicate with other parts of system 900. Interconnect 911 includes an on-chip interconnect, such as an IOSF, AMBA, or other interconnects discussed above, which may implement one or more aspects of the described disclosure.

Interconnect 911 provides communication channels to the other components, such as a Subscriber Identity Module (SIM) 930 to interface with a SIM card, a boot ROM 935 to hold boot code for execution by cores 906 and 907 to initialize and boot SoC 900, a SDRAM controller 940 to interface with external memory (e.g. DRAM 960), a flash controller 945 to interface with non-volatile memory (e.g. Flash 965), a peripheral control 950 (e.g. Serial Peripheral Interface) to interface with peripherals, video codecs 920 and Video interface 925 to display and receive input (e.g. touch-enabled input), GPU 915 to perform graphics related computations, etc. Any of these interfaces may incorporate aspects of the embodiments described herein.

In addition, the system illustrates peripherals for communication, such as a Bluetooth module 970, 3G modem 975, GPS 980, and Wi-Fi 985. Note as stated above, a UE includes a radio for communication. As a result, these peripheral communication modules may not all be included. However, in a UE some form of a radio for external communication should be included.

Figure 10:
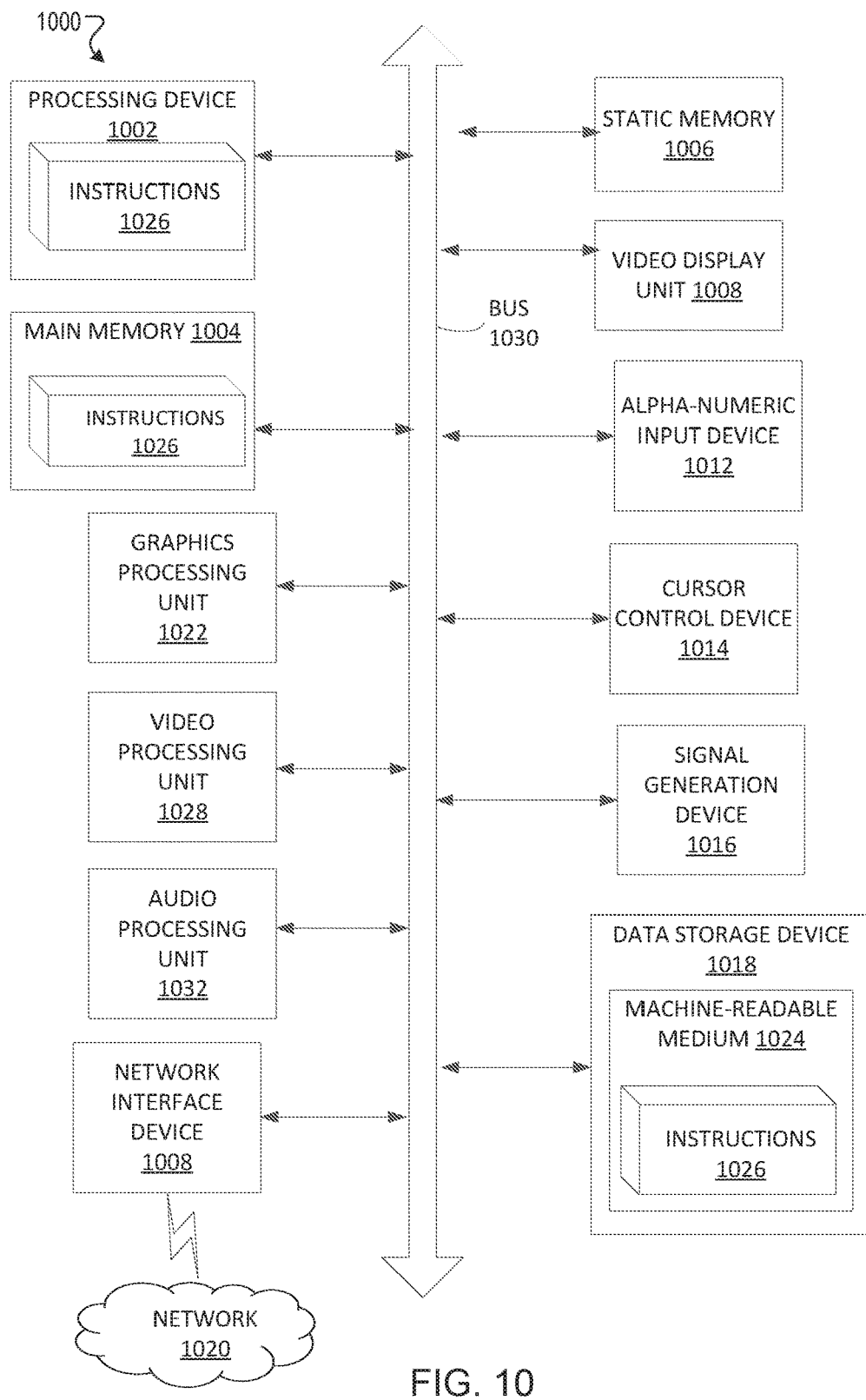
FIG. 10 illustrates another implementation of a block diagram of a computing system.

FIG. 10 illustrates a diagrammatic representation of a machine in the example form of a computing system 1000 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client device in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. The embodiments of the computer system 100 may be implemented in computing system 1000.

The computing system 1000 includes a processing device 1002, main memory 1004 (e.g., read-only memory (ROM), flash memory, dynamic random access memory (DRAM) (such as synchronous DRAM (SDRAM) or DRAM (RDRAM), etc.), a static memory 1006 (e.g., flash memory, static random access memory (SRAM), etc.), and a data storage device 1018, which communicate with each other via a bus 1030.

Processing device 1002 represents one or more general-purpose processing devices such as a microprocessor, central processing unit, or the like. More particularly, the processing device may be a complex instruction set computing (CISC) microprocessor, reduced instruction set computer (RISC) microprocessor, very long instruction word (VLIW) microprocessor, or processor implementing other instruction sets, or processors implementing a combination of instruction sets. Processing device 1002 may also be one or more special-purpose processing devices such as an application specific integrated circuit (ASIC), a field-programmable gate array (FPGA), a digital signal processor (DSP), network processor, or the like. In one embodiment, processing device 1002 may include one or processor cores. The processing device 1002 is configured to execute the instructions 1026 (e.g., processing logic) for performing the operations discussed herein. In one embodiment, processing device 1002 may include the processing circuit 104 of FIG. 1. Alternatively, the computing system 1000 may include other components as described herein. It should be understood that the core may not support multithreading (e.g., executing two or more parallel sets of operations or threads, time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology)).

The computing system 1000 may further include a network interface device 1008 communicably coupled to a network 1020. The computing system 1000 also may include a video display unit 1010 (e.g., a liquid crystal display (LCD) or a cathode ray tube (CRT)), an alphanumeric input device 1012 (e.g., a keyboard), a cursor control device 1014 (e.g., a mouse), a signal generation device 1016 (e.g., a speaker), or other peripheral devices. Furthermore, computing system 1000 may include a graphics processing unit 1022, a video processing unit 1028 and an audio processing unit 1032. In another embodiment, the computing system 1000 may include a chipset (not illustrated), which refers to a group of integrated circuits, or chips, that are designed to work with the processing device 1002 and controls communications between the processing device 1002 and external devices. For example, the chipset may be a set of chips on a motherboard that links the processing device 1002 to very high-speed devices, such as main memory 1004 and graphic controllers, as well as linking the processing device 1002 to lower-speed peripheral buses of peripherals, such as USB, PCI or ISA buses.

The data storage device 1018 may include a computer-readable storage medium 1024 on which is stored instructions 1026 (e.g., software) embodying any one or more of the methodologies of functions described herein. The instructions 1026 (e.g., software) may also reside, completely or at least partially, within the main memory 1004 as instructions 1026 and/or within the processing device 1002 as processing logic during execution thereof by the computing system 1000; the main memory 1004 and the processing device 1002 also constituting computer-readable storage media.

The computer-readable storage medium 1024 may also be used to store instructions 1026 utilizing the processing device 1002, such as the processing circuit described with respect to FIG. 1, and/or a software library containing methods that call the above applications. While the computer-readable storage medium 1024 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instruction for execution by the machine and that cause the machine to perform any one or more of the methodologies of the present embodiments. The term "computer-readable storage medium" shall accordingly be taken to include, but not be limited to, solid-state memories, and optical and magnetic media.

The following examples pertain to further embodiments.

Example 1 is a system including: 1) a processor; 2) a memory controller coupled to the processor; 3) a memory coupled to the memory controller, the memory to store a first copy of data stored according to a first test data pattern for use by a memory scrubbing operation; 4) a memory device coupled to the memory controller, where, to perform the memory scrubbing operation, the memory controller is to: a) mirror a first set of data stored in a first block of memory of the memory device to a second block of memory of the memory device; b) write the first copy of data to the first block of memory as a second copy of data; and c) send a first message to the processor indicating a memory fault error for the first block of memory when the second copy of the data has a second test data pattern that is different than the first test data pattern of the first copy.

In Example 2, the system of Example 1, where: 1) the memory is to store a third copy of data stored according to the second test data pattern for the memory scrubbing operation, and 2) the memory controller is to: write the third copy of data to the first block of memory as a fourth copy of data; identify a difference between the third copy of data and the fourth copy of data; and in response to the difference, send a second message to the processor indicating the memory fault error for the first block of memory.

In Example 3, the system of any one of Examples 1-2, where the first test data pattern is a pattern of bits associated with a first type of memory fault error and the second test data pattern is a pattern of bits associated with a second type of memory fault error.

In Example 4, the system of any one of Examples 1-3, where the memory controller is to: 1) receive a request from the processor to read the first set of data from the first block of memory; and 2) redirect the processor to read the first set of data from the second block of memory.

In Example 5, the system of any one of Examples 1-4, wherein the memory controller is further to: 1) receive a request from the processor to write a third set of data to the first block of memory while the memory controller is mirroring the first set of data to the second block of memory; and 2) direct the processor to write the third set of data to the first block of memory and the second block of memory.

In Example 6, the system of any one of Examples 1-5, where the memory controller is to mirror the first set of data from the second block of memory to the first block of memory when the second test data pattern is different than the first test data pattern.

In Example 7, the system of any one of Examples 1-6, where wherein the memory controller is to: 1) mirror a third set of data from a third block of memory of the memory device to a fourth block of memory of the memory device; 2) write the first copy of data to the third block of memory as a third copy of data; 3) determine that the first test data pattern of the first copy of the data is the same as a third test data pattern of the third copy of data; and 4) mirror the third set of data from the fourth block of memory to the third block of memory.

In Example 8, the system of any one of Examples 1-7, wherein the memory controller is to: 1) mirror a third set of data from a third block of memory of the memory device to a fourth block of memory of the memory device; 2) write the first copy of data to the third block of memory as a third copy of data; 3) determine that the first test data pattern of first copy of the data is different than a third test data pattern of the third copy of data; and 4) reroute a memory access for the third block of memory to a fifth block of memory.

Various embodiments can have different combinations of the structural features described above. For instance, all optional features of the computing system described above can also be implemented with respect to the method or process described herein and specifics in the examples can be used anywhere in one or more embodiments.

Example 9 is a memory controller to: 1) receive a first request from a processor to perform a memory scrub operation on a first block of memory of a memory circuit; and 2) mirror a first set of data stored in the first block of memory of the memory circuit to a second block of memory of the memory circuit; 3) write a first copy of data to the first block of memory as a second copy of data; 4) determine that the second copy of data has a second test data pattern that is the same as the first test data pattern of the first copy; and 5) write the first set of data from the second block of memory to the first block of memory when the second test data pattern is the same as the first test data pattern.

In Example 10, the memory controller of Example 9, where the processor is a main central processing unit (CPU) or a service processor.

In Example 11, the memory controller of any one of Examples 9-10, where the second block of memory is designated as a block of memory to store a copy of the first set of data.

In Example 12, the memory controller of any one of Examples 9-11, where the memory controller is to wait a period of time between writing the first copy of data to the first block of memory as the second copy of data and determining that the second copy of data and the first copy of data the same to provide time for a leak in at memory circuit to occur.

In Example 13, the memory controller of any one of Examples 9-12, where the memory controller is to: 1) copy a third set of data from a third block of memory of the memory circuit to a fourth block of memory of the memory circuit; 2) write the first copy of data to the third block of memory as a third copy of the data; 3) determine that the first copy of the data has a different test data pattern than a third test data pattern of the third copy of data; and 4) send a message to a processor core indicating a memory fault error for the first block of memory.

In Example 14, the memory controller of any one of Examples 9-13, the memory control unit is t:1) receive a second request to write a third set of data to the first block of memory while the memory controller is to determine that the first copy of data has a different test data pattern than a third test data pattern of a third copy of data; and 2) redirect the processor core to write to the third set of data to the second block of memory.

In Example 15, the memory controller of any one of Examples 9-14, where the memory circuit is a dual in-line memory module (DIMM).

Various embodiments can have different combinations of the structural features described above. For instance, all optional features of the computing system described above can also be implemented with respect to the method or process described herein and specifics in the examples can be used anywhere in one or more embodiments.

Example 16 is a method including: 1) receiving a request from a processing circuit to perform a memory scrubbing operation for a first block of memory at a memory device; 2) mirroring a first set of data stored in the first block of memory of the memory device to a second block of memory of the memory device; 3) writing a first copy of data to the first block of memory as a second copy of data; 4) determining that the second copy of data has a second test data pattern that is different than a first test data pattern of the first copy; and 5) sending a message to the processing circuit indicating a memory fault error for the first block of memory when the second test data pattern is different than the first test data pattern.

In Example 17, the method of Example 16, where the message indicates the memory fault error is caused by memory leakage at the memory device or a degradation of the memory device.

In Example 18, the method of any one of Examples 16-17, where the determining that the second copy of data has a second test data pattern that is different than the first test data pattern of the first copy is performed by a memory controller or a processor executing a memory scrubbing program.

In Example 19, the method of any one of Examples 16-18, where the processing circuit is a main central processing unit (CPU) or a service processor.

In Example 20, the method of any one of Examples 16-19, where receiving the request, mirroring the first set of data, writing the first copy of data, determining that the second copy of data has a second test data pattern that is different than a first test data pattern of the first copy, and sending the message are performed at a server while the server is active.

Various embodiments may have different combinations of the structural features described above. For instance, all optional features of the computing system described above may also be implemented with respect to the method or process described herein and specifics in the examples may be used anywhere in one or more embodiments.

While the present disclosure has been described with respect to a limited number of embodiments, those skilled in the art will appreciate numerous modifications and variations therefrom. It is intended that the appended claims cover all such modifications and variations as fall within the true spirit and scope of this present disclosure.

In the description herein, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, to one skilled in the art that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computing system have not been described in detail in order to avoid unnecessarily obscuring the present disclosure.

The embodiments are described with reference to access control in specific integrated circuits, such as in computing platforms or microprocessors. The embodiments may also be applicable to other types of integrated circuits and programmable logic devices. For example, the disclosed embodiments are not limited to desktop computing systems or portable computers, such as the Intel® Ultrabooks™ computers. And may be also used in other devices, such as handheld devices, tablets, other thin notebooks, systems on a chip (SoC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that may perform the functions and operations taught below. It is described that the system may be any kind of computer or embedded system. The disclosed embodiments may especially be used for low-end devices, like wearable devices (e.g., watches), electronic implants, sensory and control infrastructure devices, controllers, supervisory control, and data acquisition (SCADA) systems, or the like. Moreover, the apparatuses, methods, and systems described herein are not limited to physical computing devices, but may also relate to software optimizations for energy conservation and efficiency. As will become readily apparent in the description below, the embodiments of methods, apparatuses, and systems described herein (whether in reference to hardware, firmware, software, or a combination thereof) are vital to a 'green technology' future balanced with performance considerations.

Although the embodiments herein are described with reference to a processor, other embodiments are applicable to other types of integrated circuits and logic devices. Similar techniques and teachings of embodiments of the present disclosure may be applied to other types of circuits or semiconductor devices that may benefit from higher pipeline throughput and improved performance. The teachings of embodiments of the present disclosure are applicable to any processor or machine that performs data manipulations. However, the present disclosure is not limited to processors or machines that perform 512 bit, 256 bit, 128 bit, 64 bit, 32 bit, or 16 bit data operations and may be applied to any processor and machine in which manipulation or management of data is performed. In addition, the description herein provides examples, and the accompanying drawings show various examples for the purposes of illustration. However, these examples should not be construed in a limiting sense as they are merely intended to provide examples of embodiments of the present disclosure rather than to provide an exhaustive list of all possible implementations of embodiments of the present disclosure.

Although the below examples describe instruction handling and distribution in the context of execution units and logic circuits, other embodiments of the present disclosure may be accomplished by way of a data or instructions stored on a machine-readable, tangible medium, which when performed by a machine cause the machine to perform functions consistent with at least one embodiment of the disclosure. In one embodiment, functions associated with embodiments of the present disclosure are embodied in machine-executable instructions. The instructions may be used to cause a general-purpose or special-purpose processor that is programmed with the instructions to perform the steps of the present disclosure. Embodiments of the present disclosure may be provided as a computer program product or software which may include a machine or computer-readable medium having stored thereon instructions which may be used to program a computer (or other electronic devices) to perform one or more operations according to embodiments of the present disclosure. Alternatively, operations of embodiments of the present disclosure might be performed by specific hardware components that contain fixed-function logic for performing the operations, or by any combination of programmed computer components and fixed-function hardware components.

Instructions used to program logic to perform embodiments of the disclosure may be stored within a memory in the system, such as DRAM, cache, flash memory, or other storage. Furthermore, the instructions may be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine-readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, a reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as may be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, wherein the latent state the apparatus, hardware, and/or element is designed to perform a particular task when the apparatus, hardware, and/or element is operating.

Furthermore, use of the phrases 'to,' capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computing systems have been used. For example, the decimal number ten may also be represented as a binary value of 1010 and a hexadecimal letter A. Therefore, a value includes any representation of information capable of being held in a computing system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element.

A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information therefrom.

Instructions used to program logic to perform embodiments of the disclosure may be stored within a memory in the system, such as DRAM, cache, flash memory, or other storage. Furthermore, the instructions may be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer)

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplary language does not necessarily refer to the same embodiment or the same example, but may refer to different and distinct embodiments, as well as potentially the same embodiment.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like. The blocks described herein may be hardware, software, firmware or a combination thereof.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "defining," "receiving," "determining," "issuing," "linking," "associating," "obtaining," "authenticating," "prohibiting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Also, the terms "first," "second," "third," "fourth," etc. as used herein are meant as labels to distinguish among different elements and may not necessarily have an ordinal meaning according to their numerical designation.

What is claimed is:

1. A system comprising:
a processor;
a memory controller coupled to the processor;
a memory device coupled to the memory controller, the memory controller to store a first copy of data having a first test data pattern for use by a memory scrubbing operation, wherein, to perform the memory scrubbing operation, the memory controller is to:
mirror a first set of data stored in a first block of memory of the memory device to a second block of memory of the memory device;
write the first copy of data to the first block of memory as a second copy of data;
read the second copy of data from the first block of memory, the second copy of data having a second test data pattern;
compare the second copy of data read from the first block of memory with the first copy of data stored at the memory controller; and
send a first message to the processor indicating a memory fault error for the first block of memory when the second test data pattern is different than the first test data pattern, wherein at least a portion of the memory scrubbing operation is performed while the first block of memory is actively accessed by the processor.

2. The system of claim 1, wherein the memory is to store a third copy of data having a third test data pattern for the memory scrubbing operation, and wherein the memory controller is to:
write the third copy of data to the first block of memory as a fourth copy of data;
read the fourth copy of data from the first block of memory;
identify a difference between the third copy of data and the fourth copy of data; and
in response to the difference, send a second message to the processor indicating the memory fault error for the first block of memory.

3. The system of claim 2, wherein the first test data pattern is a pattern of bits associated with a first type of memory fault error and the third test data pattern is a pattern of bits associated with a second type of memory fault error.

4. The system of claim 1, wherein the memory controller is to:
receive a request from the processor to read the first set of data from the first block of memory; and
redirect the processor to read the first set of data from the second block of memory.

5. The system of claim 1, wherein the memory controller is further to:
receive a request from the processor to write a third set of data to the first block of memory while the memory controller is mirroring the first set of data to the second block of memory; and
direct the processor to write the third set of data to the first block of memory and the second block of memory.

6. The system of claim 1, wherein the memory controller is to mirror the first set of data from the second block of memory to the first block of memory when the second test data pattern is different than the first test data pattern.

7. The system of claim 1, wherein the memory controller is to:
mirror a third set of data from a third block of memory of the memory device to a fourth block of memory of the memory device;
write the first copy of data to the third block of memory as a third copy of data;
read the third copy of data from the third block of memory, the third copy of data having a third test data pattern;
determine that the first test data pattern of the first copy of the data is the same as the third test data pattern of the third copy of data; and
mirror the third set of data from the fourth block of memory to the third block of memory.

8. The system of claim 1, wherein the memory controller is to:

mirror a third set of data from a third block of memory of the memory device to a fourth block of memory of the memory device;

write the first copy of data to the third block of memory as a third copy of data;

read the third copy of data from the third block of memory, the third copy of data having a third test data pattern;

determine that the first test data pattern of first copy of the data is different than the third test data pattern of the third copy of data; and reroute a memory access for the third block of memory to a fifth block of memory.

9. A method comprising:

receiving a request from a processing circuit to perform a memory scrubbing operation for a first block of memory at a memory device, wherein at least a portion of the memory scrubbing operation is performed while the first block of memory is actively accessed by the processing circuit;

mirroring a first set of data stored in the first block of memory of the memory device to a second block of memory of the memory device;

writing a first copy of data to the first block of memory as a second copy of data, the first copy of data having a first test data pattern;

reading the second copy of the data from the first block of memory, the second copy of data having a second test data pattern;

determining that the second test data pattern is different than the first test data pattern; and sending a message to the processing circuit, the message indicating a memory fault error for the first block of memory when the second test data pattern is different than the first test data pattern.

10. The method of claim 9, wherein the message indicates the memory fault error is caused by memory leakage at the memory device or a degradation of the memory device.

11. The method of claim 9, wherein the determining that the second test data pattern is different than the first test data pattern is performed by a memory controller or a processor executing a memory scrubbing program.

12. The method of claim 9, wherein the processing circuit is a central processing unit (CPU) or a service processor.

13. The method of claim 9, wherein the processing circuit is part of a server device, wherein receiving the request, mirroring the first set of data, writing the first copy of data, determining that the second test data pattern is different than the first test data pattern, and sending the message are performed while the server device is active.

* * * * *